United States Patent
Iwasaki et al.

(10) Patent No.: US 8,262,848 B2
(45) Date of Patent: Sep. 11, 2012

(54) PLASMA PROCESSING APPARATUS AND METHOD

(75) Inventors: Masahide Iwasaki, Nirasaki (JP); Tomoaki Ukei, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/951,904

(22) Filed: Nov. 22, 2010

(65) Prior Publication Data

US 2011/0068087 A1    Mar. 24, 2011

Related U.S. Application Data

(62) Division of application No. 11/092,911, filed on Mar. 30, 2005, now Pat. No. 7,846,293.

(30) Foreign Application Priority Data

Apr. 8, 2004 (JP) ................................. 2004-114240

(51) Int. Cl.
*H01L 21/00* (2006.01)
*C23C 16/00* (2006.01)

(52) U.S. Cl. ................................. 156/345.46

(58) Field of Classification Search ............. 156/345.43, 156/345.44, 345.45, 345.46, 345.47, 345.42, 156/345.49; 118/723 E, 723 MA, 723 MR
See application file for complete search history.

(56) References Cited

U.S. PATENT DOCUMENTS

| | | | |
|---|---|---|---|
| 4,842,707 A | 6/1989 | Kinoshita | |
| 5,032,205 A | 7/1991 | Hershkowitz et al. | |
| 5,304,277 A | 4/1994 | Ohara et al. | |
| 5,961,773 A * | 10/1999 | Ichimura et al. | 156/345.42 |
| 6,074,518 A | 6/2000 | Imafuku et al. | |
| 6,523,493 B1 | 2/2003 | Brcka | |
| 7,008,300 B1 * | 3/2006 | Molnar | 451/41 |
| 7,067,034 B2 | 6/2006 | Bailey, III | |
| 7,419,567 B2 | 9/2008 | Iwasaki et al. | |
| 2004/0058545 A1 * | 3/2004 | Gotkis et al. | 438/692 |
| 2004/0121610 A1 | 6/2004 | Russell | |

FOREIGN PATENT DOCUMENTS

| | | | |
|---|---|---|---|
| CN | 1164122 A | | 11/1997 |
| JP | 62069621 A | * | 3/1987 |
| JP | 04324631 A | | 11/1992 |
| JP | 06181187 A | | 6/1994 |
| JP | 06325899 A | | 11/1994 |
| JP | 08-264515 | | 10/1996 |
| JP | 08-311668 | | 11/1996 |
| JP | 08293448 A | * | 11/1996 |
| JP | 08293488 A | * | 11/1996 |
| JP | 9-8009 | | 1/1997 |
| JP | 10-163173 | | 6/1998 |
| JP | 10163173 A | | 6/1998 |

(Continued)

*Primary Examiner* — Ram Kackar
*Assistant Examiner* — Anna Crowell
(74) *Attorney, Agent, or Firm* — Oblon, Spivak, McClelland, Maier & Neustadt, L.L.P.

(57) ABSTRACT

A plasma processing apparatus includes a worktable in a process chamber to horizontally place a target substrate thereon. A plasma generation space is defined above and around the worktable within the process chamber. The plasma generation space includes a peripheral plasma region and a main plasma region respectively located outside and inside an outer edge of the target substrate placed on the worktable. The apparatus further includes a magnetic field forming mechanism configured to form a magnetic field within the peripheral plasma region. The magnetic field includes magnetic force lines extending through the peripheral plasma region between a start position and an end position, at least one of which is located radially inside a sidewall of the process chamber.

12 Claims, 8 Drawing Sheets

FOREIGN PATENT DOCUMENTS

| | | | |
|---|---|---|---|
| JP | 2000268995 A | * | 9/2000 |
| JP | 2000-323463 | | 11/2000 |
| JP | 2001152332 A | | 6/2001 |
| JP | 2002289595 A | * | 10/2002 |
| JP | 2003-124198 | | 4/2003 |
| JP | 2003124192 A | * | 4/2003 |
| KR | 2003-005241 | | 1/2003 |

* cited by examiner

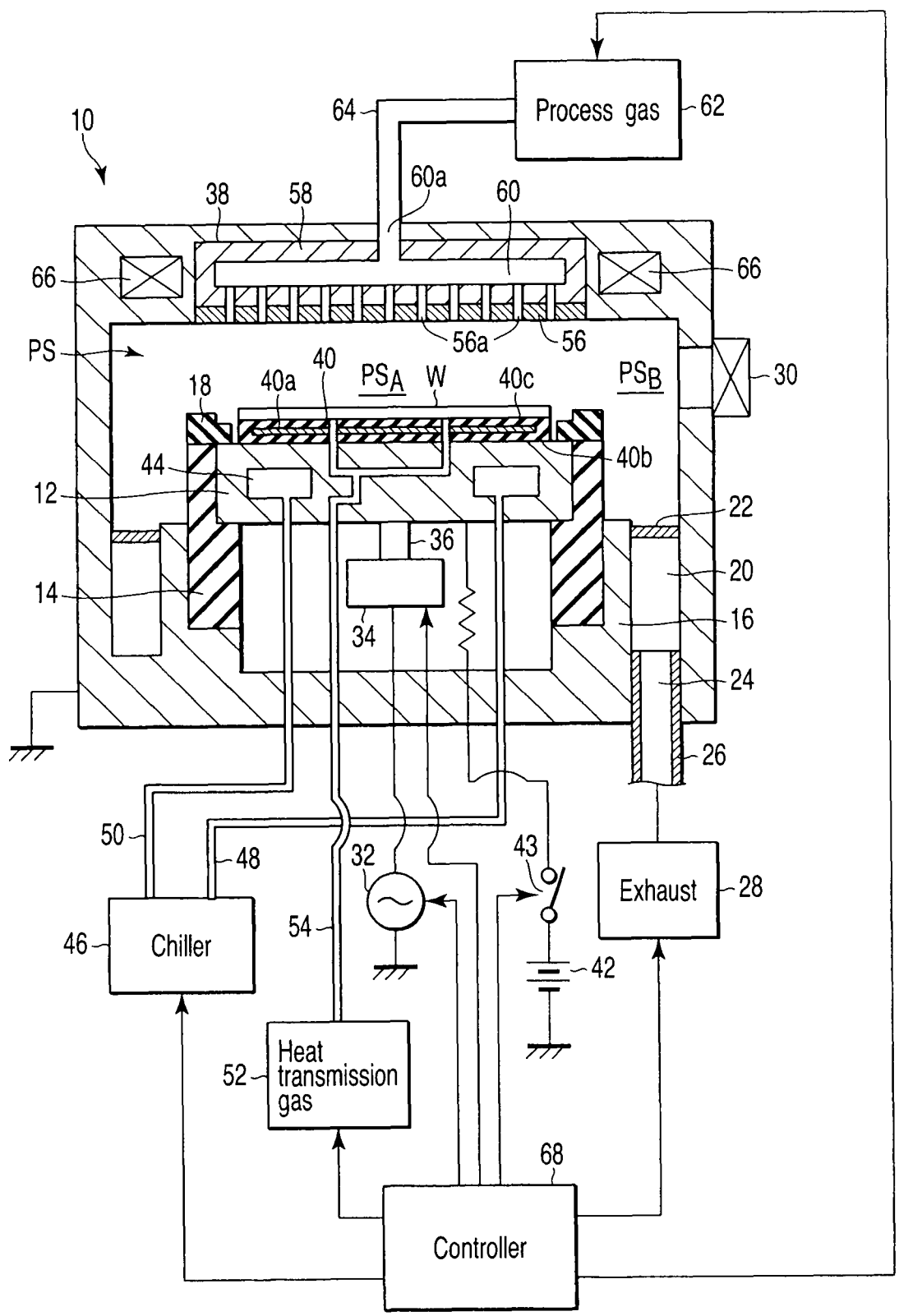
F I G. 1

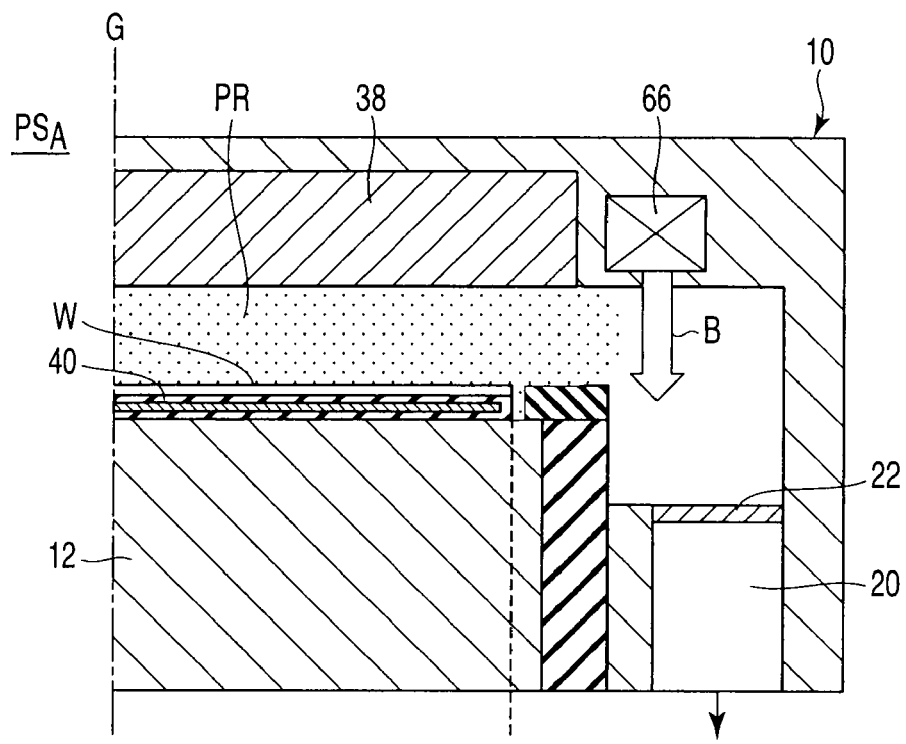
F I G. 5 A
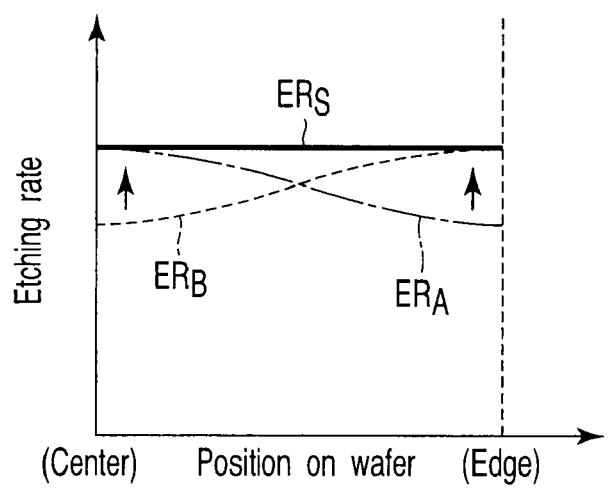
F I G. 5 B

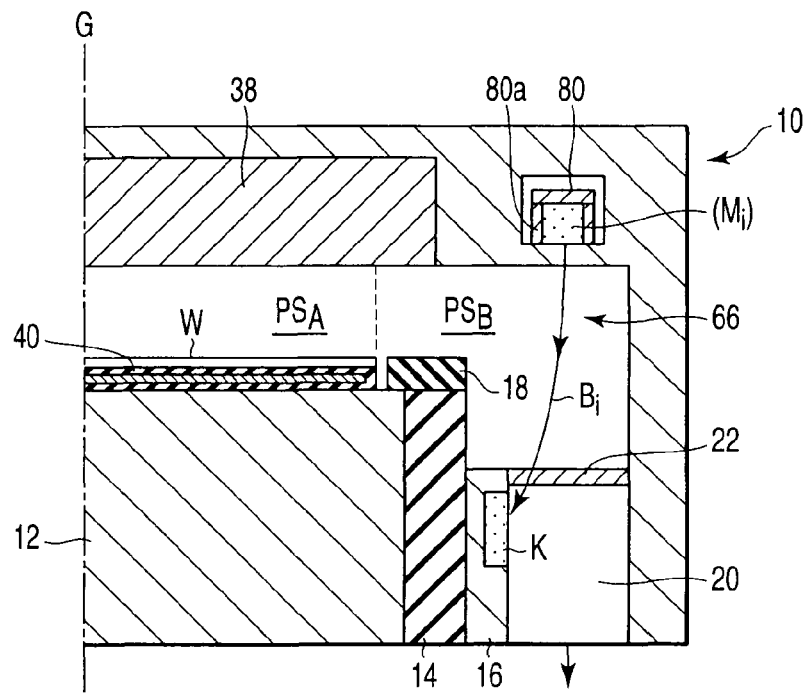
F I G. 8
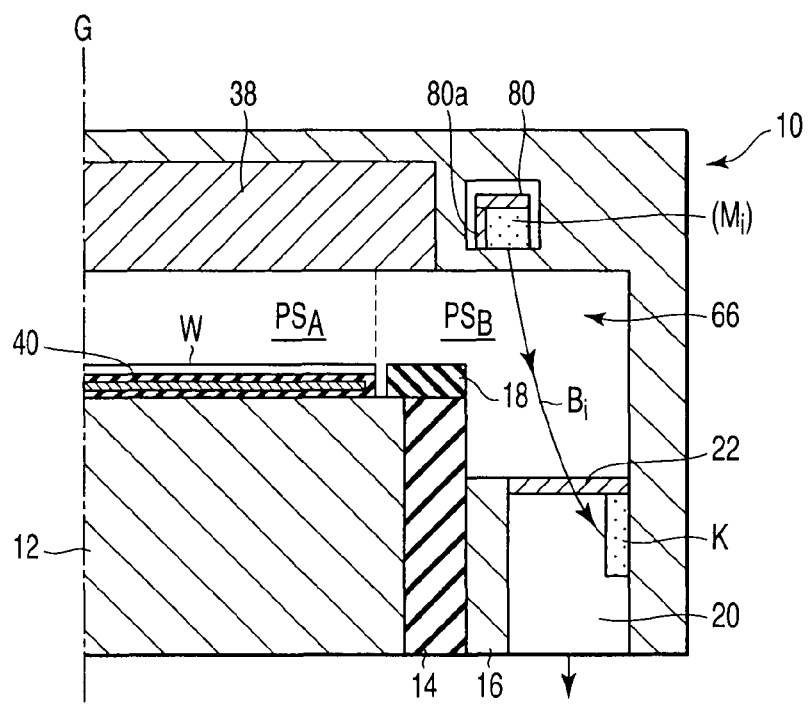
F I G. 9

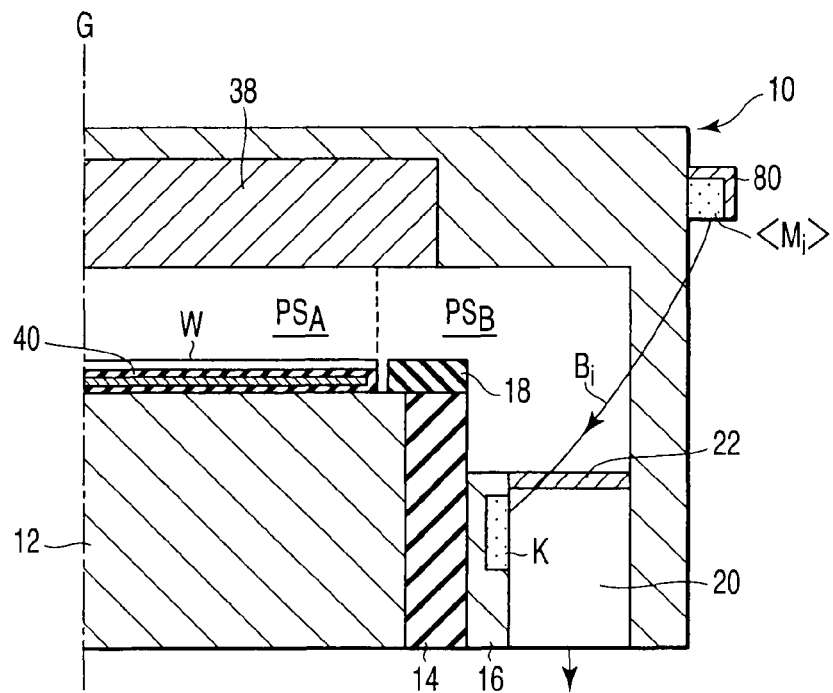
F I G. 10
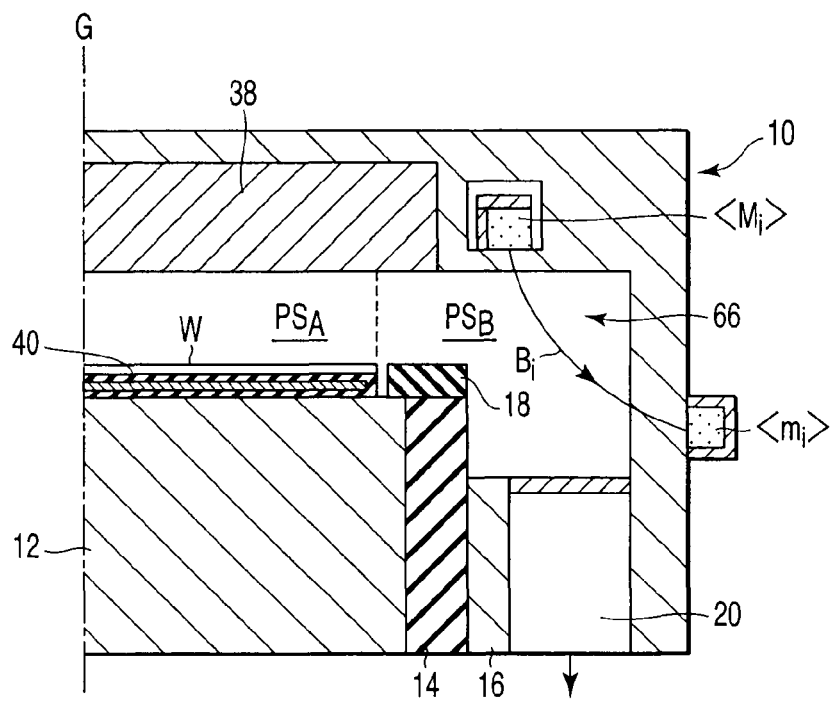
F I G. 11

PLASMA PROCESSING APPARATUS AND METHOD

CROSS-REFERENCE TO RELATED APPLICATIONS

This application is a division of and is based upon and claims the benefit of priority under 35 U.S.C. §120 for U.S. Ser. No. 11/092,911, filed Mar. 30, 2005, and claims the benefit of priority under 35 U.S.C. §119 from Japanese Patent Application No. 2004-114240, filed Apr. 8, 2004, the entire contents of each of which are incorporated herein by reference.

BACKGROUND OF THE INVENTION

1. Field of the Invention

The present invention relates to an apparatus and method for performing a plasma process on a target substrate, and particularly to a semiconductor processing apparatus and method of the single substrate type which utilize radio frequency (RF) discharge to generate plasma. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices and FPDs (Flat Panel Display), plasma is often used for processes, such as etching, deposition, oxidation, and sputtering, so that process gases can react well at a relatively low temperature. Plasma generation systems used for semiconductor processing apparatuses (plasma processing apparatuses) are classified broadly into the type utilizing glow discharge or RF discharge, and the type utilizing microwaves.

In general, a plasma processing apparatus of the single substrate type utilizing RF discharge includes a process chamber configured to reduce the pressure therein, and a worktable or susceptor disposed in the process chamber and functioning as an electrode as well. A target substrate, such as a semiconductor wafer or a glass substrate, is placed on the susceptor. Then, the pressure within the process chamber is reduced to a predetermined vacuum level, and a process gas is supplied into the process chamber. When the gas pressure within the process chamber comes to a set value, an RF power is applied to the electrode. With this arrangement, the process gas starts electric discharge, thereby generating gas plasma. Using this plasma, a micro fabrication process, such as dry etching, or a film-formation process, such as chemical vapor growth, is performed on a surface or target portion of the substrate.

In such a plasma processing apparatus utilizing RF discharge, as the gas pressure is set low, the density of gas molecules becomes low, thereby making it difficult to start electric discharge (plasma ignition) or sustain the electric discharge. Particularly, where the plasma processing apparatus is of a parallel-plate type, this characteristic is prominent, and, even if the inter-electrode gap is set smaller, or the RF voltage applied across the electrodes is set lager, the energy given to electrons from the electric field, i.e., energy for ionizing gas molecules or atoms, is insufficient, thereby likely making electric discharge unstable. However, as the case may be, plasma processes use a low gas pressure, small inter-electrode gap, or low RF applied voltage, as preferable process conditions. For example, anisotropic etching preferably uses a low gas pressure to obtain a vertically etched shape in a desired state, and thus requires characteristics for starting electric discharge and sustaining the electric discharge within a low pressure range.

As a conventional technique in this field, an ignition plasma method is known, which uses initial conditions to start electric discharge, and then switches them to the main process conditions after the electric discharge has stabilized. Used as the initial conditions suitable for electric discharge are conditions employing a specific high pressure (for example, Jpn. Pat. Appln. KOKAI Publication No. 2003-124198), a different gas, or a high RF power. A method of assisting plasma generation by microwaves or UV rays is also known as being effective.

However, since the ignition plasma method uses conditions different from the main process conditions for a certain period of time, there are some disadvantages in that the process is affected and the throughput is reduced. Similarly, as regards the method employing microwaves or UV rays, there are also some problems in that the process may be affected, and the apparatus becomes complex, which increases the apparatus cost. As a consequence, conventionally, there is no choice but to adopt the type utilizing microwaves, such as ECR (Electron Cyclotron Resonance), in applications for generating plasma under a low pressure.

BRIEF SUMMARY OF THE INVENTION

An object of the present invention is to provide a plasma processing apparatus and method, which can easily start RF discharge and stably sustain the electric discharge with a simple and low cost structure.

Another object of the present invention is to provide a plasma processing apparatus and method, which can effectively confine plasma at a high density above a target substrate to improve the reaction rate and planar uniformity of a plasma process.

According to a first aspect of the present invention, there is provided a plasma processing apparatus comprising:

a process chamber configured to reduce a pressure therein;

a worktable disposed in the process chamber and configured to place a target substrate thereon in an essentially horizontal state, a plasma generation space being defined above and around the worktable within the process chamber, and the plasma generation space including a peripheral plasma region and a main plasma region respectively located outside and inside an outer edge of the target substrate placed on the worktable;

a process gas supply section configured to supply a process gas into the plasma generation space;

an electric field forming mechanism configured to form an RF electric field within the plasma generation space; and a magnetic field forming mechanism configured to form a magnetic field within the peripheral plasma region, the magnetic field comprising magnetic force lines extending through the peripheral plasma region between a start position and an end position, at least one of which is located radially inside a sidewall of the process chamber.

In the case of the apparatus according to the first aspect, the magnetic field forming mechanism forms a substantial magnetic field within the peripheral plasma region. With this arrangement, when the electric field forming mechanism forms an RF electric field within the plasma generation space, the process gas starts electric discharge first at the peripheral plasma region in which the magnetic field is present. Then, the electric discharge instantaneously spreads over the entire plasma generation space, thereby establishing glow discharge or plasma generation. The RF discharge thus started is assisted or sustained thereafter also by the magnetic field formed within the peripheral plasma region. As a consequence, as long as the etching gas and the RF power are supplied, electric discharge or plasma generation is stably sustained within the entire plasma generation space. As described above, the magnetic field formed within the peripheral plasma region trigger start of RF discharge and assist sustainment of the electric discharge. As a consequence, it is possible to easily start the electric discharge and stably sustain the electric discharge, even under conditions with, e.g., a low gas pressure.

The magnetic field forming mechanism may be configured to set the main plasma region to have substantially no magnetic field. As a consequence, it is possible to prevent or reduce the probability that the target substrate is affected by a magnetic field and thereby damaged or given stress.

The magnetic field forming mechanism may be configured to form a magnetic field vertically extending like a curtain surrounding the main plasma region. This prevents plasma from flowing out of the main plasma region, and thus effectively and efficiently confines the plasma therein. As a consequence, the plasma can have a higher density and higher uniformity within the main plasma region, thereby improving the reaction rate and planar uniformity of the plasma process.

The magnetic field is formed within the magnetic field forming mechanism such that at least one of the start position and the end position of the magnetic force lines is disposed radially inside a sidewall of the process chamber. This can minimize the number and size of magnetic pole members corresponding to the start position or the end position disposed at the inner side, in forming a magnetic field of a high density within the peripheral plasma region.

It may be arranged such that each of the start position and the end position is located directly above or directly below the peripheral plasma region.

It may also be arranged such that one of the start position and the end position is located directly above or directly below the peripheral plasma region, while the other is located outside the sidewall of the process chamber.

Further, it may be arranged such that the start position and the end position are located on the same side above or below the plasma generation space. In this case, the magnetic force lines of the magnetic field make U-turns extending through the peripheral plasma region from the start position to the end position.

It may also be arranged such that one of the start position and the end position is located above the plasma generation space, while the other is located below the plasma generation space. In this case, the magnetic force lines of the magnetic field extend upward or downward across the peripheral plasma region from the start position to the end position.

According to a second aspect of the present invention, there is provided a plasma process method comprising:

placing a target substrate in an essentially horizontal state within a process chamber configured to reduce a pressure therein, a plasma generation space being defined within the process chamber, and the plasma generation space including a peripheral plasma region and a main plasma region respectively located outside and inside an outer edge of the target substrate;

supplying a process gas into the plasma generation space;

forming an RF electric field within the plasma generation space; and forming a magnetic field within the peripheral plasma region, the first magnetic field, the magnetic field comprising magnetic force lines extending through the peripheral plasma region between a start position and an end position, at least one of which is located radially inside a sidewall of the process chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a sectional view showing a plasma processing apparatus for a semiconductor process according to an embodiment of the present invention;

FIG. 5A is a sectional view schematically showing one function of the magnetic field forming mechanism of the apparatus shown in FIG. 1;

FIG. 5B is a graph showing the relationship between the magnetic field formation and etching rate (normalized value);

FIG. 8 is a sectional view showing a main part of a magnetic field forming mechanism according to another embodiment of the present invention;

FIG. 9 is a sectional view showing a main part of a magnetic field forming mechanism according to still another embodiment of the present invention;

FIG. 10 is a sectional view showing a main part of a magnetic field forming mechanism according to still another embodiment of the present invention;

FIG. 11 is a sectional view showing a main part of a magnetic field forming mechanism according to still another embodiment of the present invention.

DETAILED DESCRIPTION OF THE INVENTION

Figure 2:
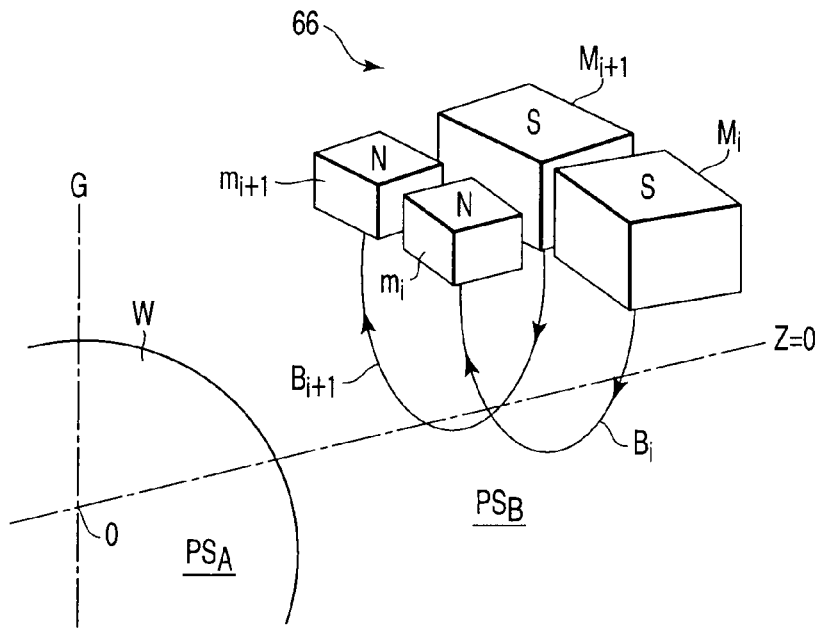
FIG. 2 is an enlarged perspective view showing a part of the magnetic field forming mechanism of the apparatus shown in FIG. 1.

Embodiments of the present invention will now be described with reference to the accompanying drawings. In the following description, the constituent elements having substantially the same function and arrangement are denoted by the same reference numerals, and a repetitive description will be made only when necessary.

FIG. 1 is a sectional view showing a plasma processing apparatus for a semiconductor process according to an embodiment of the present invention. This plasma processing apparatus is structured as a plasma etching apparatus of a parallel-plate type. The plasma etching apparatus includes a cylindrical process chamber (process container) 10, which is made of a metal, such as aluminum or stainless steel, and is protectively grounded.

The process chamber 10 is provided with a circular lower electrode or susceptor (worktable) 12 disposed therein, on which a target substrate or semiconductor wafer W is placed. The susceptor 12 is made of, e.g., aluminum, and is supported through an insulative cylindrical holder 14 on a cylindrical support portion 16, which extends vertically upward from the bottom of the process chamber 10. A focus ring 18 made of, e.g., quartz is disposed on top of the cylindrical holder 14 to annularly surround the top surface of the susceptor 12.

An exhaust passage 20 is defined between the sidewall of the process chamber 10 and the cylindrical support portion 16. The exhaust passage 20 is provided with a circular baffle plate 22 attached at the entrance or middle, and an exhaust port 24 formed at the bottom. The exhaust port 24 is connected to an exhaust apparatus 28 through an exhaust line 26. The exhaust apparatus 28 includes a vacuum pump for reducing the pressure of the process space within the process chamber 10 to a predetermined vacuum level. A transfer port for a semiconductor wafer W is formed in the sidewall of the process chamber 10 and is opened/closed by a gate valve 30.

The susceptor 12 is electrically connected to a radio frequency (RF) power supply 32 for generating plasma, through a matching device 34 and a power feeding rod 36. The RF power supply 32 is arranged to apply an RF power of a predetermined frequency, such as 60 MHz, to the susceptor 12 used as a lower electrode. A showerhead 38 is disposed on the ceiling of the process chamber 10 to face the susceptor 12 in parallel therewith, and is used as an upper electrode with a ground potential, as described later. The RF power applied from the RF power supply 32 is used to form an RF electric field in the space between the susceptor 12 and showerhead 38, which is defined as a plasma generation space PS.

The plasma generation space PS mentioned herein is not limited to the space radially inside the outer edges of the susceptor 12 and showerhead 38, but expands through the space radially outside the outer edges up to the inner wall or sidewall of the process chamber 10. A region $PS_A$ of the plasma generation space PS radially inside the outer edge of a substrate W placed on the susceptor 12 is called a "main plasma region". A region $PS_B$ outside the "main plasma region", i.e., radially outside the outer edge of the substrate W, is called a "peripheral plasma region".

The susceptor 12 is provided with an electrostatic chuck 40 on the top, for holding the semiconductor wafer W by an electrostatic attraction force. The electrostatic chuck 40 comprises an electrode 40a made of a conductive film, and a pair of insulating films 40b and 40c sandwiching the electrode 40a. The electrode 40a is electrically connected to a direct-current (DC) power supply 42 through a switch 43. With a DC voltage applied from the DC power supply 42, the electrostatic chuck 40 attracts and holds the semiconductor wafer W on the chuck by a Coulomb force.

The susceptor 12 is further provided with a cooling medium space 44 formed therein and annularly extending therethrough. A cooling medium set at a predetermined temperature, such as cooling water, is circulated within the cooling medium space 44 from a chiller unit 46 through lines 48 and 50. The temperature of the cooling medium is set to control the process temperature of the semiconductor wafer W placed on the electrostatic chuck 40. Further, a heat transmission gas, such as He gas, is supplied from a heat transmission gas supply unit 52, through gas supply line 54, into the interstice between the top surface of the electrostatic chuck 40 and the bottom surface of the semiconductor wafer W.

The showerhead 38 disposed at the ceiling includes an electrode plate 56 on the bottom side having a number of gas delivery holes 56a, and an electrode support 58 detachably supporting the electrode plate 56. The electrode support 58 has a buffer space 60 formed therein, which has a gas feed port 60a connected to a process gas supply section 62 through a gas feed line 64.

A magnetic field forming mechanism 66 is disposed at the ceiling of the process chamber 10 directly above the peripheral plasma region $PS_B$ (preferably around the showerhead 38), and extends annularly or concentrically therewith. The magnetic field forming mechanism 66 serves to easily start RF discharge (plasma ignition) at the plasma generation space PS within the process chamber 10, and stably sustain the electric discharge. The structure and function of the magnetic field forming mechanism 66 will be described later in detail.

A control section 68 is arranged to control the operations of respective parts of the plasma etching apparatus, such as the exhaust apparatus 28, RF power supply 32, electrostatic chuck switch 43, chiller unit 46, heat transmission gas supply unit 52, and process gas supply section 62. The control section 68 is also connected to the host computer (not shown).

When the plasma etching apparatus is used for etching, the following operations are performed. Specifically, at first, the gate valve 30 is opened, and a semiconductor wafer W to be processed is transferred into the process chamber 10, and placed on the susceptor 12 in a horizontal state. Then, a DC voltage is applied from the DC power supply 42 to the electrode 40a of the electrostatic chuck 40, so as to fix the semiconductor wafer W onto the electrostatic chuck 40. Then, an etching gas (mixture gas in general) is supplied at a predetermined flow rate and flow ratio from the process gas supply section 62 into the process chamber 10, while the process chamber 10 is exhausted by the exhaust apparatus 28, to set the pressure within the process chamber 10 at a set value. In this state, an RF power is applied at a predetermined power level from the RF power supply 32 to the susceptor 12. With this arrangement, the etching gas delivered from the showerhead 38 is turned into plasma by electric discharge within the plasma generation space PS. The main surface of the semiconductor wafer W is etched by radicals and ions generated from the plasma.

According to the plasma etching apparatus, the magnetic field forming mechanism 66 disposed at the ceiling of the process chamber 10 forms a substantial magnetic field only within the peripheral plasma region $PS_B$ of the plasma generation space PS. When an RF power is applied from the RF power supply 32 to the susceptor 12, the etching gas starts electric discharge first at the peripheral plasma region $PS_B$ with the magnetic field formed therein. Then, the electric discharge instantaneously spreads over the entire plasma generation space PS, thereby establishing glow discharge or plasma generation. The RF discharge thus started is assisted or sustained thereafter also by the magnetic field formed within the peripheral plasma region $PS_B$. As a consequence, as long as the etching gas and the RF power are supplied, electric discharge or plasma generation is stably sustained within the entire plasma generation space PS.

The magnetic field contribute to start and sustainment of the RF discharge, because electric charges (mainly electrons) drifting within the RF electric field receive a force (Lorentz force) from the magnetic field, and generate accelerated velocity in the direction of the force, thereby increasing the energy for ionizing gas molecules and atoms. It should be noted that, within the peripheral plasma region $PS_B$, the RF electric field is formed mainly between the inner wall (ceiling and sidewall) of the process chamber 10 and the lower electrode 12.

As described above, the magnetic field formed within the peripheral plasma region $PS_B$ triggers start of RF discharge and assists sustainment of the electric discharge. As a consequence, it is possible to easily start the electric discharge and stably sustain the electric discharge, even under conditions with a low gas pressure (for example, 10 mTorr or less), small inter-electrode gap, and low RF applied voltage. As an example, in the case of an etching process for poly-crystalline silicon, which employs only HBr gas as an etching gas, the conventional technique cannot start electric discharge (plasma ignition) if the gas pressure is 5 mTorr or less. On the other hand, it has been confirmed that, in the same etching process, this embodiment can reliably start electric discharge and stably sustain the electric discharge even if the gas pressure is 5 mTorr or less.

Further, the magnetic field forming mechanism 66 sets the main plasma region $PS_A$ to have substantially no magnetic field. As a consequence, it is possible to prevent or reduce the probability that the semiconductor wafer W placed on the susceptor 12 is affected by a magnetic field and devices formed on the wafer are thereby damaged or given stress. The state with no magnetic field, in which devices formed on the wafer are not damaged or given stress, is preferably a state having a magnetic field intensity of the geomagnetic level (for example 0.5 G) or less, but some processes are not affected by an intensity of about 5 G (which can be called a state with substantially no magnetic field).

Figure 3:
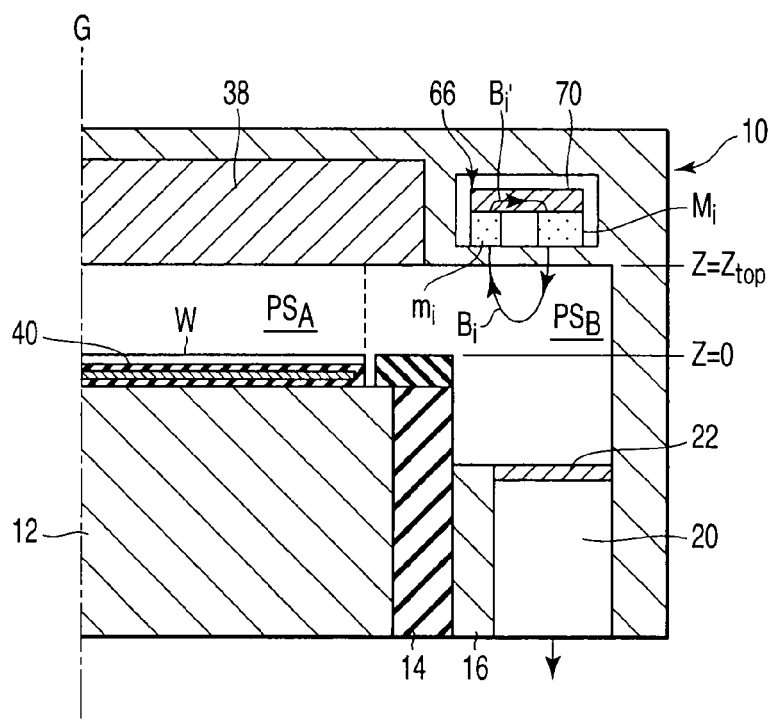
FIG. 3 is a sectional view showing a main part of the magnetic field forming mechanism of the apparatus shown in FIG. 1.

FIG. 2 is an enlarged perspective view showing a part of the magnetic field forming mechanism of the apparatus shown in FIG. 1. FIG. 3 is a sectional view showing a main part of the magnetic field forming mechanism of the apparatus shown in FIG. 1.

As shown in FIG. 2, the magnetic field forming mechanism 66 includes a field forming unit $[M_i, m_i]$ formed of a pair of segment magnets $M_i$ and $m_i$ disposed at an interval in the radial direction of the process chamber 10. Preferably, the number N (N is an integer of 2 or higher) of magnetic field forming units $[M_1, m_1], [M_2, m_2], \ldots, [M_N, m_N]$ are annularly arrayed at regular intervals overall.

For each of the magnetic field forming units $[M_i, m_i]$, the segment magnet $M_i$ on the radially outer side has a rectangular parallelepiped shape and is disposed to direct the N-pole face downward. On the other hand, the segment magnet $m_i$ on the radially inner side has a rectangular parallelepiped shape and is disposed to direct the S-pole face downward. For example, each of the segment magnets $M_i$ and $m_i$ is formed of a permanent magnet, such as a rare earth magnet (e.g., samarium-cobalt magnet, neodymium magnet).

The magnetic force lines $B_i$ emitted from the bottom side (N-pole) of the outer segment magnet $M_i$ extend to reach the bottom side (S-pole) of the inner segment magnets $m_i$, such that these lines once go down into the peripheral plasma region $PS_B$ directly therebelow, and then make U-turns upward to describe parabolas. At the next magnetic field forming unit $[M_{i+1}, m_{i+1}]$, magnetic force line $B_{i+1}$ form loops the same as those described above. This magnetic field forming unit $[M_{i+1}, m_{i+1}]$ is located at a position separated from the magnetic field forming unit $[M_i, m_i]$ by a predetermined angular distance (for example, 15° in the case of N=24) in the annular direction.

As shown in FIG. 3, a yoke 70 is disposed on or above the magnetic field forming units $[M_i, m_i]$. The backside or top side (S-pole) of each of the outer segment magnets $M_i$ is magnetically coupled with the backside or top side (N-pole) of each of the inner segment magnets $m_i$ through the yoke 70. More specifically, the magnetic force lines $B_i$, emitted from the backside (N-pole) of each of the inner segment magnets $m_i$ mainly extend through the yoke 70 and reach the backside (S-pole) of each of the outer segment magnets $M_i$. For example, the yoke 70 is formed of a ring expanding continuously over all the magnetic field forming units $[M_1, m_1], [M_2, m_2], \ldots, [M_N, m_N]$.

As described above, at each of the magnetic field forming units $[M_i, m_i]$, the magnetic force lines $B_i$ emitted from the bottom side (N-pole) of the outer segment magnet $M_i$ extend to reach the bottom side (S-pole) of the inner segment magnets $m_i$ while making U-turns upward. The magnetic force lines $B_i$ form loops extending through the peripheral plasma region $PS_B$ directly therebelow, without diverging therefrom in the radial direction. This can increase the magnetic flux density within the peripheral plasma region $PS_B$, and effectively prevent magnetic force lines from entering the main plasma region $PS_A$. In order to further enhance these effects of the magnetic force line loop structure, the outer segment magnets $M_i$ and the inner segment magnets $m_i$ are preferably arranged such that the former ones $M_i$ more distant from the substrate W have a larger magnetic quantity (magnetic pole intensity), while the latter ones $m_i$ closer to the substrate W have a smaller magnetic quantity (magnetic pole intensity).

The respective portions of the magnetic field forming mechanism 66 (particularly the magnetic field forming units $[M_i, m_i]$) are disposed directly above the peripheral plasma region $PS_B$, i.e., radially inside the sidewall of the process chamber 10. The magnetic field forming mechanism thus has a smaller radial distance from the center of the process chamber and a smaller peripheral length, as compared to a case where a magnetic field forming mechanism is disposed outside the sidewall of the process chamber 10. In this case, the number of magnets or magnetic poles and the magnetic quantity thereof (in proportion to the size or volume) can be remarkably reduced in forming a suitable profile of a magnetic field within the peripheral plasma region $PS_B$. As a consequence, it is possible to suppress increase in the apparatus size and cost due to the installation of the magnetic field forming mechanism 66, to the minimum.

It should be noted that a suitable profile of the magnetic field within the peripheral plasma region $PS_B$ is a profile that can provide a strong magnetic field near the main plasma region $PS_A$ as close as possible, without magnetically affecting the main plasma region $PS_A$.

Figure 4A:
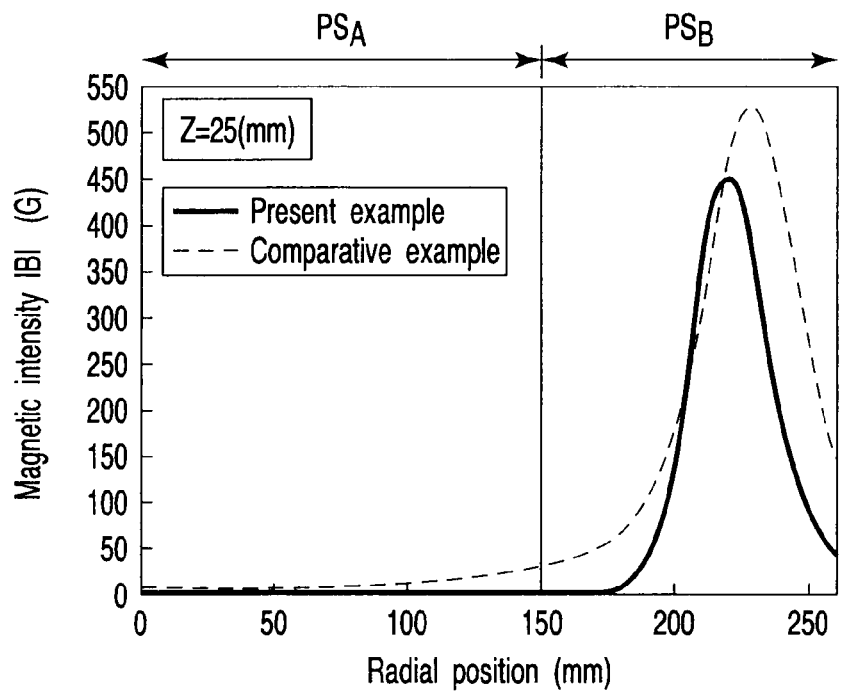
FIG. 4A is a graph showing a magnetic field intensity distribution according to a present example (on the bottom surface of the upper electrode) within a plasma generation space.
Figure 4B:
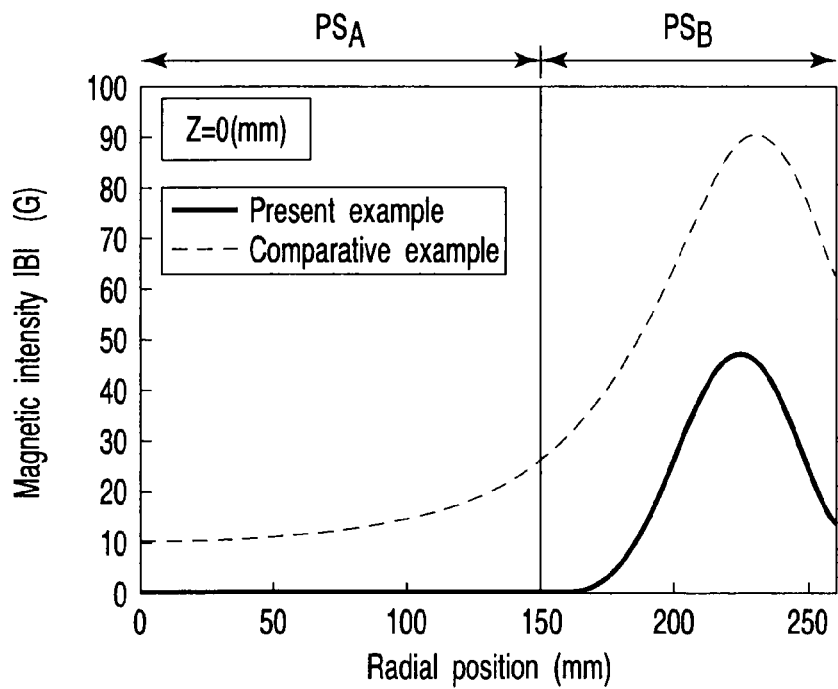
FIG. 4B is a graph showing the magnetic field intensity distribution according to a present example (on the top surface of a wafer) within the plasma generation space.

FIGS. 4A and 4B are graphs showing a magnetic field intensity distribution according to a present example within the plasma generation space PS. In the present example, it is assumed that a semiconductor wafer having a diameter of 300 mm is used as a target substrate W, the inner diameter of the process chamber 10 is about 260 mm, and the inter-electrode gap is 25 mm. FIG. 4A shows a radial direction distribution of the magnetic field intensity (the average value in the annular direction) at the position on the bottom surface of the upper electrode 38 (at the top position of the inter-electrode gap: Z=25 mm). FIG. 4B shows a radial direction distribution of the magnetic field intensity (the average value in the annular direction) at the position on the top surface of the semiconductor wafer W placed on the susceptor 12 (at the bottom position of the inter-electrode gap: Z=0 mm). In FIGS. 4A and 4B, the solid lines denote the characteristics obtained by the magnetic field forming mechanism 66 described above (the present example), while the broken lines denote the characteristics obtained by a structure excluding the inner segment magnets $m_i$ from the magnetic field forming mechanism 66 (a comparative example).

As shown in FIGS. 4A and 4B, in the case of the comparative example, a magnetic field expands beyond the peripheral plasma region $PS_B$ into the main plasma region $PS_A$. This is so, because the magnetic force lines $B_i$ emitted from the bottom sides (N-poles) of the outer segment magnets $M_i$ easily diverge therefrom in the radial direction. On the other hand, in the case of the present example, the magnetic field scarcely expands beyond the peripheral plasma region $PS_B$ into the main plasma region $PS_A$. This is so, because the magnetic force lines $B_i$ emitted from the bottom sides (N-poles) of the outer segment magnets $M_i$ make U-turns to reach the inner segment magnets $m_i$, without diverging therefrom in the radial direction. In practice, the magnetic field forming mechanism 66 according to the present example can reduce the magnetic field intensity within the main plasma region $PS_A$ to the geomagnetic level (for example, 0.5 G) or less. On the other hand, the peak values of the magnetic field intensity within the peripheral plasma region $PS_B$ are as high as 40 G to 450 G, and thus are sufficient to trigger start of RF discharge and assist sustainment of the electric discharge.

The magnetic field intensity distributions shown in FIGS. 4A and 4B are states at the top position of the inter-electrode gap (Z=25 mm) and at the bottom position of the inter-electrode gap (Z=0 mm), respectively. It can be easily understood that positions between the electrodes (0 mm<Z<25 mm) have magnetic field intensity distributions intermediate between those shown in FIGS. 4A and 4B.

In another aspect of this embodiment, the magnetic field forming mechanism 66 forms a magnetic field B vertically extending like a curtain surrounding the main plasma region $PS_A$ (i.e., a magnetic field perpendicular to the diffusion direction of plasma). FIG. 5A is a sectional view schematically showing one function of the magnetic field forming mechanism of the apparatus shown in FIG. 1, in this aspect. FIG. 5B is a graph showing the relationship between the magnetic field formation and etching rate (normalized value). As shown in FIG. 5A, this curtain-type vertical magnetic field B prevents plasma PR from flowing out of the main plasma region $PS_A$, and thus effectively and efficiently confines the plasma PR therein. As a consequence, the plasma PR can have a higher density and higher uniformity within the main plasma region $PS_A$, thereby improving the plasma etching property on the semiconductor wafer W.

For example, a structure can be assumed such that no curtain-type vertical magnetic field B is formed within the peripheral plasma region $PS_B$. If such a structure is applied to processes for oxide films (for example, etching of a silicon oxide film), the etching rate is apt to decrease on the wafer edge side relative to the wafer central side, as shown by a chain line $ER_A$ in FIG. 5B. Also, if such a structure is applied to processes for poly-crystals (for example, etching of polycrystalline silicon), the etching rate is apt to decrease on the wafer central side relative to the wafer edge side, as shown by a broken line $ER_B$ in FIG. 5B.

On the other hand, according to this embodiment, a curtain-type vertical magnetic field B is formed within the peripheral plasma region $PS_B$ by the magnetic field forming mechanism 66. Where this arrangement is applied to processes for oxide films, the etching rate recovers on the wafer edge side more than the wafer central side to improve the planar uniformity, as shown by a solid line $ER_S$ in FIG. 5B. Also, where this arrangement is applied to processes for poly-crystals, the etching rate recovers on the wafer central side more than the wafer edge side to improve the planar uniformity, as shown by a solid line $ER_S$ in FIG. 5B.

Figure 6:
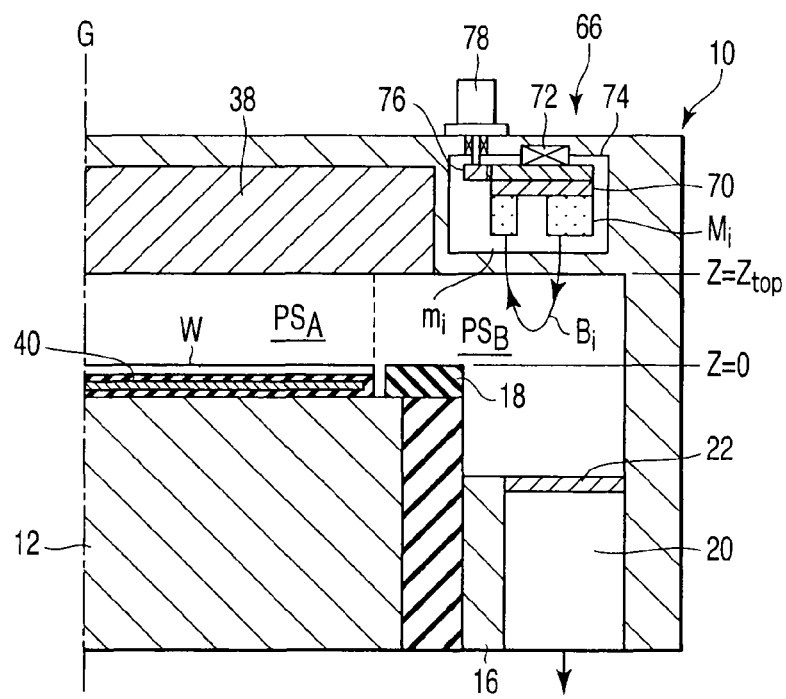
FIG. 6 is a sectional view showing a modification of the magnetic field forming mechanism of the apparatus shown in FIG. 1.
Figure 7:
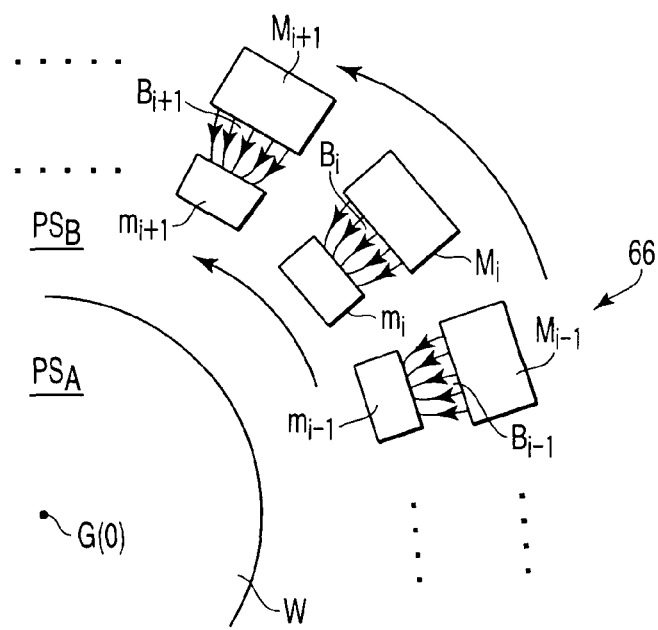
FIG. 7 is a plan view showing a main part of the apparatus shown in FIG. 6.

FIG. 6 is a sectional view showing a modification of the magnetic field forming mechanism 66 of the apparatus shown in FIG. 1. FIG. 7 is a plan view showing a main part of the apparatus shown in FIG. 6. According to this modification, the magnetic field forming units $[M_1, m_1], [M_2, m_2], \ldots, [M_N, m_N]$ are rotatable at a constant speed about a vertical line G extending through the center of the process chamber 10 (the center O of the semiconductor wafer W). In other words, the magnetic field forming mechanism 66 includes a rotation mechanism for rotating the magnetic field described above in the annular direction.

More specifically, the magnetic field forming units $[M_1, m_1], [M_2, m_2], \ldots, [M_N, m_N]$ are attached through the yoke 70 to a ring-like internal gear 74 rotatable about a guide 72. An external gear 76 engages with the internal gear 74 and connected to the rotary shaft of an electric motor 78. With this arrangement, a uniform magnetic field intensity distribution can be obtained in the annular direction, even where the number N of the magnetic field forming units $[M_i, m_i]$ is small. Particularly, there is a case where a deposition film is formed on the ceiling of the process chamber 10 directly below the magnetic field forming mechanism 66 due to the vertical magnetic field. In this case, the uniform magnetic field intensity distribution allows the conditions and thickness of the deposition film to be uniform over the entire circumference.

FIGS. 8 and 9 are sectional views each showing a main part of a magnetic field forming mechanism according to different two other embodiments of the present invention. In these embodiments, one or a plurality of magnets $<M_i>$ are disposed directly above the peripheral plasma region $PS_B$ (preferably, at the ceiling of the process chamber 10 around the showerhead 38). For example, the magnet $<M_i>$ corresponds to the outer segment magnets $M_i$ shown in FIGS. 2 to 7, and is disposed to direct the N-pole face downward.

On the other hand, a member that can be given magnetism by an external magnetic field, i.e., a paramagnetic substance K, is disposed directly below the peripheral plasma region $PS_B$, e.g., near the exhaust passage 20 or baffle plate 22. In the structure shown in FIG. 8, the paramagnetic substance K is attached to the cylindrical support portion 16 within the exhaust passage 20. In the structure shown in FIG. 9, the paramagnetic substance K is attached to the chamber sidewall within the exhaust passage 20. For example, the paramagnetic substance K comprises a plurality of segment paramagnetic substances disposed at regular intervals in the annular direction. Alternatively, the paramagnetic substance K may be formed of a single paramagnetic substance ring. The paramagnetic substance K is made of a material selected from the group consisting of metals, ferrites, or ceramics.

According to the structure shown in each of FIGS. 8 and 9, the magnetic force lines $B_i$ emitted from the bottom side (N-pole) of the magnet $<M_i>$ extend across the peripheral plasma region $PS_B$ directly therebelow to the paramagnetic substance K in an almost vertical direction. The paramagnetic substance K is magnetized when receiving the magnetic force lines $B_i$, such that the receiving surface becomes the S-pole. In order to direct the magnetic force lines $B_i$ from the magnet $<M_i>$ toward the paramagnetic substance K as quickly as possible, a yoke 80 is disposed to surround the backside (top side) and lateral side of the magnet <$M_i$>. Particularly, a side yoke portion 80a close to the main plasma region $PS_A$ functions to take in magnetic force lines, which have been emitted from the bottom side (N-pole) of the magnet <$M_i$> toward the main plasma region $PS_A$, and feed them back to the top side or backside (S-pole) of the magnet <$M_i$>, so as to prevent them from entering the main plasma region $PS_A$.

FIG. 10 is a sectional view showing a main part of a magnetic field forming mechanism according to still another embodiment of the present invention. This embodiment is a modification of the embodiment shown in FIG. 8, wherein a magnet <$M_i$> is attached to the outside of the sidewall of the process chamber 10, above the plasma generation space PS ($PS_A$, $PS_B$). The magnet <$M_i$> is disposed to direct the N-pole face downward. On the other hand, a paramagnetic substance K is attached to the cylindrical support portion 16 within the exhaust passage 20, directly below the peripheral plasma region $PS_B$.

In the embodiments shown in FIGS. 8 to 10, the magnet <$M_i$> may be disposed to inversely direct their upper and lower magnetic poles, such that the S-pole is directed downward. Also, the positions of the magnet <$M_i$> and paramagnetic substance K may be exchanged with each other. Further, the magnet <$M_i$> and paramagnetic substance K may be respectively disposed inside and outside the sidewall of the process chamber 10.

Similarly, the embodiment shown in FIGS. 1 to 7 may be modified in various ways. For example, in the magnetic field forming units [$M_i$, $m_i$], the outer segment magnets <$M_i$> and the inner segment magnets $m_i$ may be disposed to inversely direct their upper and lower magnetic poles. In this case, each of the outer segment magnets $M_i$ is disposed to direct the S-pole face downward, while each of the inner segment magnets $m_i$ is disposed to direct the N-pole face downward. Further, one of the groups of the segment magnets (typically the inner segment magnets $m_i$) may be replaced with paramagnetic substances. In addition, each of the magnetic field forming units [$M_i$, $m_i$] may be arranged such that the magnets $M_i$ and $m_i$ are arrayed in a direction other than the radial direction.

Furthermore, one of the groups of the segment magnets may be disposed outside the sidewall of the process chamber 10. As an example, FIG. 11 is a sectional view showing a main part of a magnetic field forming mechanism according to still another embodiment of the present invention. In this embodiment, a magnet <$M_i$> is built in the ceiling of the process chamber 10 around the showerhead 38, directly above the peripheral plasma region $PS_B$. The magnet <$M_i$> is disposed to direct the N-pole face downward. On the other hand, a magnet <$m_i$> is attached to the outside of the sidewall of the process chamber 10, blow the plasma generation space PS ($PS_A$, $PS_B$). The magnet <$m_i$> is disposed to direct the S-pole face laterally inward (toward the inside of the process chamber 10).

Figure 12:
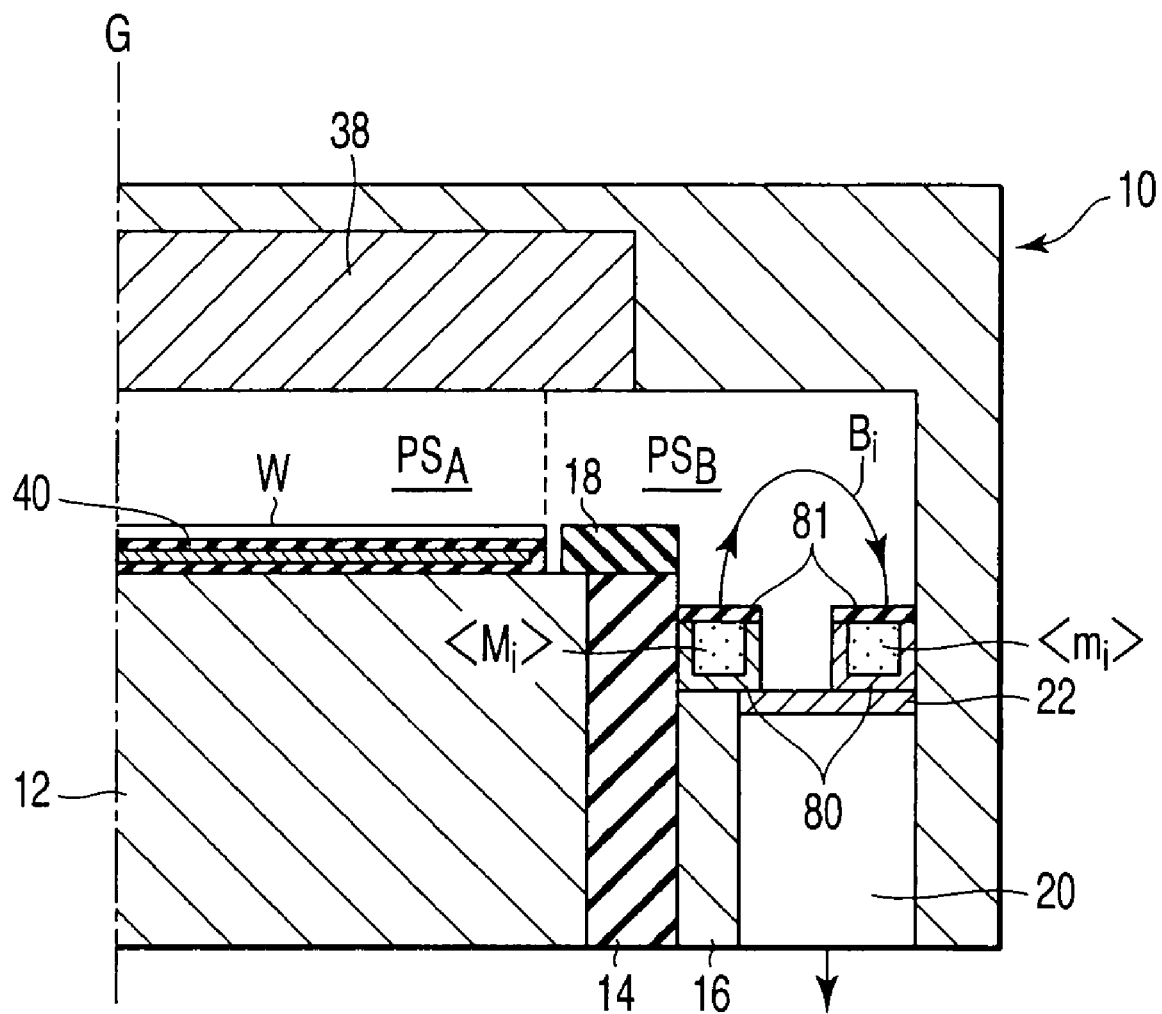
FIG. 12 is a sectional view showing a main part of a magnetic field forming mechanism according to still another embodiment of the present invention.

Furthermore, the magnetic field forming units [$M_i$, $m_i$] may be disposed below the peripheral plasma region $PS_B$. As an example, FIG. 12 is a sectional view showing a main part of a magnetic field forming mechanism according to still another embodiment of the present invention. In this embodiment, a magnet <$M_i$> is attached to the susceptor 12 side directly below the peripheral plasma region $PS_B$ and disposed to direct the N-pole face upward. A magnet <$m_i$> is attached to the sidewall of the process chamber 10 directly below the peripheral plasma region $PS_B$ and disposed to direct the S-pole face upward. The top of each of the magnets <$M_i$> and <$m_i$> is covered with an insulative plate 81, while the other sides are covered with a yoke 80.

In FIG. 1, the plasma processing apparatus provided with the magnetic field forming mechanism 66 is of the parallel-plate type in which an RF power for plasma generation is applied to the susceptor 12. Alternatively, the plasma etching apparatus may be of the type in which an RF power for plasma generation is applied to the upper electrode 38. Further, the plasma etching apparatus may be of the type in which first and second RF powers with different frequencies are respectively applied to the upper electrode 38 and susceptor 12 (the type applying RFs to the upper and lower side). Furthermore, the plasma etching apparatus may be of the type in which first and second RF powers with different frequencies are superimposed and applied to the susceptor 12 (the type applying superimposed two frequencies to the lower side).

The mechanism for exciting plasma is not limited to those of the parallel-plate type, and it may be of another RF discharge type, such as the helicon wave plasma type. Further, the process performed by the plasma processing apparatus is not limited to plasma etching, and it may be another plasma process, such as plasma CVD, plasma oxidation, plasma nitridation, or sputtering. In the broad sense, the present invention is applicable to various plasma processing apparatuses which utilize an RF electric field formed within a pressure-reduced process chamber. A plasma processing apparatus according to the present invention may be combined with the ignition plasma method. Further, the target substrate is not limited to a semiconductor wafer, and it may be one of various substrates for flat panel displays, or a photo-mask, CD substrate, or printed circuit board.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing apparatus comprising:
    a process chamber configured to reduce a pressure therein;
    a lower electrode disposed in the process chamber and serving as a worktable to place a target substrate thereon in an essentially horizontal state;
    an upper electrode disposed in parallel with the lower electrode with a gap therebetween inside the process chamber such that a plasma generation space is defined within a space surrounded by the upper electrode, the lower electrode, and a sidewall of the process chamber, and the plasma generation space includes an outer plasma region and an inner plasma region respectively located radially outside and inside an outer edge of the lower electrode;
    a process gas supply section configured to supply a process gas into the plasma generation space;
    an electric field forming mechanism configured to apply an RF power across the upper electrode and the lower electrode so as to form an RF electric field within the plasma generation space; and
    a magnetic field forming mechanism configured to form a magnetic field within the outer plasma region, the magnetic field being formed of magnetic force lines extending upward or downward across the outer plasma region between a group of start positions and a group of end positions,
    wherein one of the group of start positions and the group of end positions is provided by upper segments respectively formed of permanent magnets arrayed at intervals entirely in an annular direction directly above the outer plasma region and radially between the outer edge of the lower electrode and the sidewall of the process chamber, such that the upper segments have the same pole, which is one of an N-pole and an S-pole, directed downward, the other of the group of start positions and the group of end positions is provided by a lower member disposed below the outer plasma region and radially outside the outer edge of the lower electrode, the lower member being made of a paramagnetic substance and formed of lower segments arrayed at intervals entirely or a single ring extending entirely in an annular direction, and each of the upper segments is equipped with a yoke disposed thereon and configured to direct magnetic force lines from the upper segment toward the lower member, the yoke including an upper portion and an inner portion respectively covering an upper side and a radially inner side of the upper segment, without covering a lower side of the upper segment, such that the inner portion of the yoke functions to take in part of magnetic force lines, which have been emitted from the lower side of the upper segment toward the inner plasma region, and feed the part back to the upper side of the upper segment, so as to prevent the part from entering the inner plasma region.

2. The apparatus according to claim 1, wherein the magnetic field forming mechanism is configured to set the inner plasma region to have substantially no magnetic field.

3. The apparatus according to claim 1, wherein the process gas supply section is configured to supply the process gas between the upper electrode and the lower electrode.

4. The apparatus according to claim 1, wherein the lower member is located directly below the outer plasma region and radially between the outer edge of the lower electrode and the sidewall of the process chamber.

5. The apparatus according to claim 1, wherein the lower member is located below the outer plasma region and radially outside the sidewall of the process chamber.

6. A plasma process method in the apparatus according to claim 1, the method comprising:
    placing the target substrate in an essentially horizontal state on the lower electrode within a process chamber;
    supplying the process gas into the plasma generation space;
    forming the RF electric field within the plasma generation space to generate plasma of the process gas; and
    processing the target substrate by the plasma while utilizing the magnetic field formed within the outer plasma region.

7. The method according to claim 6, wherein the inner plasma region is set to have substantially no magnetic field.

8. The apparatus according to claim 1, wherein the lower member is formed of lower segments arrayed at intervals.

9. The apparatus according to claim 1, wherein the yoke further includes an outer portion covering a radially outer side of the upper segment opposite to the radially inner side.

10. The apparatus according to claim 1, wherein the process gas supply section includes a showerhead having gas delivery holes formed in the upper electrode.

11. The apparatus according to claim 1, wherein the process gas supply section is configured to supply, as the process gas, an etching gas for etching the target substrate.

12. The method according to claim 6, wherein the process gas is an etching gas for etching the target substrate.

* * * * *